US011041915B2

(12) United States Patent
Rumrill

(10) Patent No.: US 11,041,915 B2
(45) Date of Patent: Jun. 22, 2021

(54) DISTURBANCE DETECTING CURRENT SENSOR

(71) Applicant: Sentient Technology Holdings, LLC, Wichita, KS (US)

(72) Inventor: Ronald S. Rumrill, Union City, CA (US)

(73) Assignee: Sentient Technology Holdings, LLC, Wichita, KS (US)

( * ) Notice: Subject to any disclaimer, the term of this patent is extended or adjusted under 35 U.S.C. 154(b) by 97 days.

(21) Appl. No.: 16/574,486

(22) Filed: Sep. 18, 2019

(65) Prior Publication Data

US 2020/0088779 A1 Mar. 19, 2020

Related U.S. Application Data

(60) Provisional application No. 62/732,789, filed on Sep. 18, 2018.

(51) Int. Cl.
*G01R 31/58* (2020.01)
*G01R 19/165* (2006.01)
*G01R 15/18* (2006.01)

(52) U.S. Cl.
CPC ........... *G01R 31/58* (2020.01); *G01R 15/181* (2013.01); *G01R 19/16528* (2013.01)

(58) Field of Classification Search
CPC . G01R 31/58; G01R 19/16528; G01R 15/181
See application file for complete search history.

(56) References Cited

U.S. PATENT DOCUMENTS

| 3,075,166 | A | 1/1963 | Peek |
| 3,558,984 | A | 1/1971 | Smith et al. |
| 3,676,740 | A | 7/1972 | Schweitzer, Jr. |
| 3,686,531 | A | 8/1972 | Decker et al. |
| 3,702,966 | A | 11/1972 | Schweitzer, Jr. |
| 3,708,724 | A | 1/1973 | Schweitzer, Jr. |
| 3,715,742 | A | 2/1973 | Schweitzer, Jr. |
| 3,720,872 | A | 3/1973 | Russell et al. |
| 3,725,832 | A | 4/1973 | Schweitzer, Jr. |

(Continued)

FOREIGN PATENT DOCUMENTS

| EP | 1508146 A | 2/2005 |
| EP | 1938159 A | 7/2008 |

(Continued)

OTHER PUBLICATIONS

Chen et al.; Development of arc-guided protection devices against lightning breakage of covered conductors on distribution lines; IEEE Trans. Power Deliv.; 25(1); pp. 196-205; Jan. 2010.

(Continued)

*Primary Examiner* — Dominic E Hawkins

(57) ABSTRACT

A power distribution monitoring system is provided that can include a number of features. The system can include a plurality of monitoring devices configured to attach to individual conductors on a power grid distribution network. In some embodiments, a monitoring device includes a current sensing element comprising a Rogowski coil. The output of the Rogowski coil can be used by a fault detection circuit to determine if a fault or disturbance occurs on the conductor. Methods of using the monitoring devices are also provided.

16 Claims, 5 Drawing Sheets

(56) References Cited

U.S. PATENT DOCUMENTS

| | | |
|---|---|---|
| 3,755,714 A | 8/1973 | Link |
| 3,768,011 A | 10/1973 | Swain |
| 3,777,217 A | 12/1973 | Groce et al. |
| 3,814,831 A | 6/1974 | Olsen |
| 3,816,816 A | 6/1974 | Schweitzer, Jr. |
| 3,866,197 A | 2/1975 | Schweitzer, Jr. |
| 3,876,911 A | 4/1975 | Schweitzer, Jr. |
| 3,957,329 A | 5/1976 | McConnell |
| 3,970,898 A | 7/1976 | Baumann et al. |
| 4,063,161 A | 12/1977 | Pardis |
| 4,152,643 A | 5/1979 | Schweitzer, Jr. |
| 4,339,792 A | 7/1982 | Yasumura et al. |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle et al. |
| 4,408,155 A | 10/1983 | McBride |
| 4,466,071 A | 8/1984 | Russell, Jr. |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot et al. |
| 4,654,573 A | 3/1987 | Rough et al. |
| 4,709,339 A | 11/1987 | Fernandes |
| 4,714,893 A | 12/1987 | Smith Vaniz et al. |
| 4,723,220 A | 2/1988 | Smith Vaniz |
| 4,728,887 A | 3/1988 | Davis |
| 4,746,241 A | 5/1988 | Burbank |
| 4,766,549 A | 8/1988 | Schweitzer, III et al. |
| 4,775,839 A | 10/1988 | Kosina et al. |
| 4,808,916 A | 2/1989 | Smith Vaniz |
| 4,829,298 A | 5/1989 | Fernandes |
| 4,881,028 A | 11/1989 | Bright |
| 4,886,980 A | 12/1989 | Fernandes et al. |
| 4,904,932 A | 2/1990 | Schweitzer, Jr. |
| 4,937,769 A | 6/1990 | Verbanets |
| 5,006,846 A | 4/1991 | Granville et al. |
| 5,125,738 A | 6/1992 | Kawamura et al. |
| 5,138,265 A | 8/1992 | Kawamura et al. |
| 5,159,561 A | 10/1992 | Watanabe et al. |
| 5,181,026 A | 1/1993 | Granville |
| 5,182,547 A | 1/1993 | Griffith |
| 5,202,812 A | 4/1993 | Shinoda et al. |
| 5,206,595 A | 4/1993 | Wiggins et al. |
| 5,220,311 A | 6/1993 | Schweitzer, Jr. |
| 5,428,549 A | 6/1995 | Chen |
| 5,438,256 A | 8/1995 | Thuries et al. |
| 5,473,244 A | 12/1995 | Libove et al. |
| 5,495,169 A | 2/1996 | Smith |
| 5,550,476 A | 8/1996 | Lau et al. |
| 5,565,783 A | 10/1996 | Lau et al. |
| 5,600,248 A | 2/1997 | Westrom et al. |
| 5,608,328 A | 3/1997 | Sanderson |
| 5,650,728 A | 7/1997 | Rhein et al. |
| 5,656,931 A | 8/1997 | Lau et al. |
| 5,682,100 A | 10/1997 | Rossi et al. |
| 5,696,788 A | 12/1997 | Choi et al. |
| 5,712,796 A | 1/1998 | Ohura et al. |
| 5,729,144 A | 3/1998 | Cummins |
| 5,737,203 A | 4/1998 | Barrett |
| 5,764,065 A | 6/1998 | Richards et al. |
| 5,839,093 A | 11/1998 | Novosel et al. |
| 5,892,430 A | 4/1999 | Wiesman et al. |
| 5,905,646 A | 5/1999 | Crewson et al. |
| 5,990,674 A | 11/1999 | Schweitzer, Jr. |
| 6,002,260 A | 12/1999 | Lau et al. |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. et al. |
| 6,288,632 B1 | 9/2001 | Hoctor et al. |
| 6,292,340 B1 | 9/2001 | O'Regan et al. |
| 6,347,027 B1 | 2/2002 | Nelson et al. |
| 6,433,698 B1 | 8/2002 | Schweitzer, Jr. et al. |
| 6,459,998 B1 | 10/2002 | Hoffman |
| 6,466,030 B2 | 10/2002 | Hu et al. |
| 6,466,031 B1 | 10/2002 | Hu et al. |
| 6,477,475 B1 | 11/2002 | Takaoka et al. |
| 6,483,435 B2 | 11/2002 | Saha et al. |
| 6,549,880 B1 | 4/2003 | Willoughby et al. |
| 6,559,651 B1 | 5/2003 | Crick |
| 6,566,854 B1 | 5/2003 | Hagmann et al. |
| 6,577,108 B2 | 6/2003 | Hubert et al. |
| 6,601,001 B1 | 7/2003 | Moore |
| 6,622,285 B1 | 9/2003 | Rust et al. |
| 6,677,743 B1 | 1/2004 | Coolidge et al. |
| 6,718,271 B1 | 4/2004 | Tobin |
| 6,734,662 B1 | 5/2004 | Fenske |
| 6,798,211 B1 | 9/2004 | Rockwell et al. |
| 6,822,457 B2 | 11/2004 | Borchert et al. |
| 6,822,576 B1 | 11/2004 | Feight et al. |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov et al. |
| 6,927,672 B2 | 8/2005 | Zalitsky et al. |
| 6,949,921 B1 | 9/2005 | Feight et al. |
| 6,963,197 B1 | 11/2005 | Feight et al. |
| 6,980,090 B2 | 12/2005 | Mollenkopf |
| 7,023,691 B1 | 4/2006 | Feight et al. |
| 7,046,124 B2 | 5/2006 | Cope et al. |
| 7,053,601 B1 | 5/2006 | Fenske et al. |
| 7,072,163 B2 | 7/2006 | McCollough, Jr. |
| 7,076,378 B1 | 7/2006 | Huebner |
| 7,085,659 B2 | 8/2006 | Peterson et al. |
| 7,106,048 B1 | 9/2006 | Feight et al. |
| 7,158,012 B2 | 1/2007 | Wiesman et al. |
| 7,187,275 B2 | 3/2007 | McCollough, Jr. |
| 7,203,622 B2 | 4/2007 | Pan et al. |
| 7,272,516 B2 | 9/2007 | Wang et al. |
| 7,295,133 B1 | 11/2007 | McCollough, Jr. |
| 7,400,150 B2 | 7/2008 | Cannon |
| 7,424,400 B2 | 9/2008 | McCormack et al. |
| 7,449,991 B2 | 11/2008 | Mollenkopf |
| 7,450,000 B2 | 11/2008 | Gidge et al. |
| 7,508,638 B2 | 3/2009 | Hooper |
| 7,518,529 B2 | 4/2009 | O'Sullivan et al. |
| 7,532,012 B2 | 5/2009 | Cern |
| 7,557,563 B2 | 7/2009 | Gunn et al. |
| 7,626,794 B2 | 12/2009 | Swartzendruber et al. |
| 7,633,262 B2 | 12/2009 | Lindsey et al. |
| 7,672,812 B2 | 3/2010 | Stoupis et al. |
| 7,683,798 B2 | 3/2010 | Rostron |
| 7,701,356 B2 | 4/2010 | Curt et al. |
| 7,714,592 B2 | 5/2010 | Radtke et al. |
| 7,720,619 B2 | 5/2010 | Hou |
| 7,725,295 B2 | 5/2010 | Stoupis et al. |
| 7,742,393 B2 | 6/2010 | Bonicatto et al. |
| 7,764,943 B2 | 7/2010 | Radtke |
| 7,795,877 B2 | 9/2010 | Radtke et al. |
| 7,795,994 B2 | 9/2010 | Radtke |
| 7,804,280 B2 | 9/2010 | Deaver, Sr. et al. |
| 7,930,141 B2 | 4/2011 | Banting |
| 8,421,444 B2 | 4/2013 | Gunn |
| 8,497,781 B2 | 7/2013 | Engelhardt et al. |
| 8,594,956 B2 | 11/2013 | Banting et al. |
| 8,786,292 B2 | 7/2014 | Parsons |
| 9,182,429 B2 | 11/2015 | Saxby et al. |
| 9,229,036 B2 | 1/2016 | Kast et al. |
| 9,448,257 B2 | 9/2016 | Saxby et al. |
| 9,581,624 B2 | 2/2017 | Rostron et al. |
| 9,933,463 B2 * | 4/2018 | Danesh ............... G01R 31/52 |
| 9,954,354 B2 | 4/2018 | Baker et al. |
| 9,984,818 B2 | 5/2018 | Rumrill |
| 2004/0156154 A1 | 8/2004 | Lazarovich et al. |
| 2005/0073200 A1 | 4/2005 | Divan et al. |
| 2008/0077336 A1 | 3/2008 | Fernandes |
| 2009/0058582 A1 | 3/2009 | Webb |
| 2009/0171602 A1 * | 7/2009 | Hong ............... G01R 31/2837 |
| | | 702/65 |
| 2009/0309754 A1 | 12/2009 | Bou et al. |
| 2010/0085036 A1 | 4/2010 | Banting et al. |
| 2011/0032739 A1 | 2/2011 | Juhlin |
| 2012/0039062 A1 | 2/2012 | McBee et al. |

(56) References Cited

U.S. PATENT DOCUMENTS

| | | |
|---|---|---|
| 2012/0236611 A1 | 9/2012 | Alexandrov et al. |
| 2013/0162136 A1 | 6/2013 | Baldwin et al. |
| 2014/0062221 A1 | 3/2014 | Papastergiou et al. |
| 2014/0145858 A1 | 5/2014 | Miller et al. |
| 2014/0174170 A1 | 6/2014 | Davis |
| 2014/0192458 A1 | 7/2014 | Valdes |
| 2014/0226366 A1 | 8/2014 | Morokuma et al. |
| 2014/0253140 A1* | 9/2014 | Gilbert ............... G01R 31/282 324/527 |
| 2014/0260598 A1 | 9/2014 | Miller |
| 2015/0198667 A1 | 7/2015 | Krekeler |
| 2016/0116505 A1 | 4/2016 | Kast et al. |
| 2017/0199533 A1 | 7/2017 | McCollough |
| 2018/0143234 A1 | 5/2018 | Saxby |
| 2019/0339319 A1* | 11/2019 | Jakupi ............... G06K 9/00503 |

FOREIGN PATENT DOCUMENTS

| | | |
|---|---|---|
| EP | 2340592 A | 7/2011 |
| EP | 2350764 A | 8/2011 |

OTHER PUBLICATIONS

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).

Saha et al.; Fault Location on Power Networks (Power Systems); Springer Verlag; London, UK; 435 pgs.; 2010 (Preface: Oct. 2009).

Shepard et al.; An overview of rogowski coil current sensing technology; 13 pages; retrieved from the internet Jan. 5, 2016 (http://www.dynamp.net/ldadocum.nsf/c2270fbdd892ac3e86256e75000ad88a/e710af6d3e0f6255862565d7004b19db/$FILE/Report.pdf).

Stringfield et al.; Fault location methods for overhead lines; in Transactions of the American Institute of Electrical Engineers; Amer. Inst. of Electrical Eng.; New York, NY; Part. III; vol. 76; pp. 518-530; Aug. 1957.

Rumrill; U.S. Appl. No. 16/574,465 entitled "Systems and methods to measure primary voltage using capacitive coupled test point and grounded sensor circuit," filed 9/18/201.

Rumrill; U.S. Appl. No. 16/575,220 entitled "Systems and methods to maximize power from multiple power line energy harvesting devices," filed Sep. 18, 2019.

\* cited by examiner

DISTURBANCE DETECTING CURRENT SENSOR

CROSS REFERENCE TO RELATED APPLICATIONS

This application claims the benefit of U.S. Provisional Patent Application No. 62/732,789, filed Sep. 18, 2018, titled "Disturbance Detecting Current Sensor", the contents of which are incorporated by reference herein.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and power harvesting.

BACKGROUND

The current flow in power distribution network conductors includes the desirable fundamental power frequency of 50/60 Hz (depending on the country), and numerous types of undesirable frequencies. Broadly speaking, some of these frequencies are multiples of the fundamental frequency and are known as harmonics, while other frequencies may be more random and could be indications of various problems such as arcing, voltage breakdowns, or animal/vegetation contact. These later group of frequencies could collectively be called disturbances.

Electric utility companies attempt to sense and monitor disturbances in order to identify problems on their network. As stated above, one primary attribute of disturbance frequencies is that they are not the predominant fundamental power frequency. It is common in the industry to monitor electric conductors with current sensors. In the large majority of the cases, the foremost interest is to measure the amplitude of the fundamental frequency as a measure of the bulk current being delivered. In other cases however, the output of a current sensor may be post-processed in order to separate the any disturbance signals from the fundamental signals. Because the current sensor has just one output, and the post-processor has one input, the types of post-processing is limited.

While some fully featured monitoring devices can be configured to monitor, among other things, current flow in the power line and current waveforms, conductor temperatures, ambient temperatures, vibration, wind speed, monitoring device system diagnostics, etc., these fully featured monitoring devices can be expensive and can be overkill for situations when only a bare-bones, low-power fault detection device is required.

SUMMARY OF THE DISCLOSURE

This disclosure generally provides distribution line monitoring sensors that include a number of features. Particularly, described herein are distribution line monitoring sensors with Rogowski coil current sensing elements connected to an integrator circuit, which allows disturbances on the conductor to be clearly indicated on the output waveform.

A method of sensing a fault or disturbance on a conductor of a power distribution network is provided, comprising inducing a voltage in a Rogowski coil of a line monitoring device to produce a raw output, inputting the raw output from the Rogowski coil into an integrator circuit of the line monitoring device to produce an integrated output, inputting the raw output from the Rogowski coil into an all-pass filter of the line monitoring device to produce a filtered output, subtracting the integrated output from the filtered output to produce a fault detection output, and indicating that a fault or disturbance has occurred on the conductor if the fault detection output is a non-zero value.

In some examples, the method further comprises, prior to the inducing step, mounting the line monitoring device on the conductor.

In some embodiments, the raw output of the Rogowski coil is proportional to a rate of change of current in the conductor.

In one embodiment, a frequency response of the integrator circuit has a sloping gain and a constant phase shift of 90° over a frequency band of interest. In another embodiment, a frequency response of the all-pass filter has a sloping phase shift, with a phase shift of 90° at a fundamental frequency of the conductor, and a constant gain over the frequency band of interest.

In some embodiments, the subtracting step is performed at a fundamental frequency of the conductor. The fundamental frequency can be, for example, 60 Hz, 50 Hz.

A line monitoring device configured to detect a fault or disturbance on a conductor of a power distribution network is also provided, comprising a housing configured to be mounted to the conductor, a Rogowski coil disposed on or within the housing, wherein a voltage is induced in the Rogowski coil to produce a raw output when current flows through the conductor, a fault detection circuit disposed within the housing and being electrically coupled to the Rogowski coil, wherein the fault detection circuit comprises an integrator circuit configured to receive the raw output from the Rogowski coil and produce an integrated output, an all-pass filter configured to receive the raw output from the Rogowski coil and produce a filtered output, a summation circuit configured to subtract the integrated output from the filtered output to produce a fault detection output, wherein the fault detection output indicates a fault or disturbance on the conductor if the fault detection output has a non-zero value.

In some embodiments, the raw output of the Rogowski coil is proportional to a rate of change of current in the conductor.

In one embodiment, a frequency response of the integrator circuit has a sloping gain and a constant phase shift of 90° over a frequency band of interest. In another embodiment, a frequency response of the all-pass filter has a sloping phase shift, with a phase shift of 90° at a fundamental frequency of the conductor, and a constant gain over the frequency band of interest.

In some embodiments, the subtracting step is performed at a fundamental frequency of the conductor. The fundamental frequency can be, for example, 60 Hz, 50 Hz.

A fault detection system is further provided, comprising a conductor of a power distribution network, a housing configured to be mounted to the conductor, a Rogowski coil disposed on or within the housing, wherein the conductor is configured to induce a voltage in the Rogowski coil to produce a raw output when current flows through the conductor, a fault detection circuit disposed within the housing and being electrically coupled to the Rogowski coil, wherein the fault detection circuit comprises an integrator circuit configured to receive the raw output from the Rogowski coil and produce an integrated output, an all-pass filter configured to receive the raw output from the Rogowski coil and produce a filtered output, a summation circuit configured to subtract the integrated output from the filtered output to produce a fault detection output, wherein the fault detection output indicates a fault or disturbance on the conductor if the fault detection output has a non-zero value.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1A:
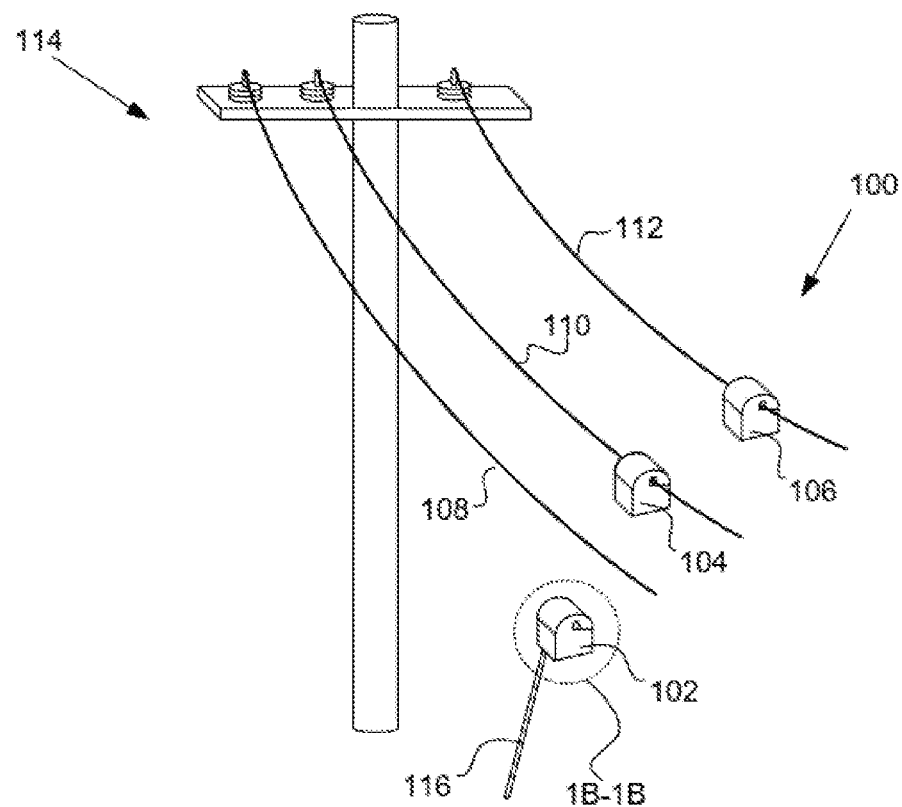
FIG. 1A is a typical over-head three-phase power distribution system utilizing a cross-bar mounted on pole for mechanical positioning of the conductors. Alternate patterns of parallel conductor routing are sometimes used. Power distribution line monitoring devices (102,104,106) are attached to the power lines typically using a standard lineman's shotgun hotstick (106) for easy deployment with necessitating turning off power in the lines.

Power line monitoring devices and systems described herein are configured to measure the currents of power grid distribution networks. Referring to FIG. 1A, monitoring system 100 comprises monitoring devices 102, 104, and 106 mounted to power lines or primary conductors 108, 110, and 112, respectively, of power distribution network 114. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 65 kV or higher) to reduce the energy lost during transmission over long distances. The monitoring devices can also be used on high voltage "transmission lines" that operate at voltages higher than 65 kV.

Monitoring devices 102, 104, and 106 can be mounted on each power line of a three-phase network, as shown. The monitoring devices can be mounted quickly and easily via a hot-stick 116, and can harvest energy from the power lines for operation without additional supplemental power (e.g., batteries or solar panels). Installation of a three monitoring device array can be placed and configured by a single linesman with a hot-stick and a bucket truck in less than 20 minutes.

Figure 1B:
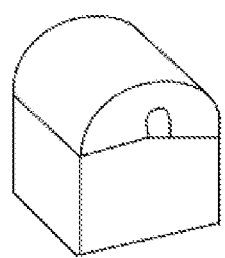
FIGS. 1B and 1C show a schematic representation of a monitoring sensor in the closed (1B) and open (1C) positions. The open position facilitates mounting the monitoring sensor on a power line. The sensor remains on the power line in the closed (1B) position.
Figure 1C:
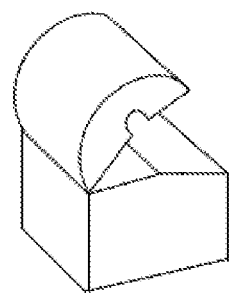

FIG. 1B illustrates a monitoring device in a closed/clamped configuration, and FIG. 1C shows the monitoring device in an opened/installation configuration. It should be understood that the device is opened into the installation configuration during installation on power lines, then closed around the line in the clamped configuration prior to operation.

The monitoring devices of the present disclosure, at a fundamental level, include only the components required to detect faults or disturbances on the power distribution network via current measurement, and include power harvesting components that enable the monitoring devices to harvest enough energy from the conductors for operation. Thus, the monitoring devices of the present disclosure are well suited for applications in which only line fault detection and self-powered operation are required, therefore providing low-power, efficient, and inexpensive line monitoring devices for power distribution networks.

Figure 2A:
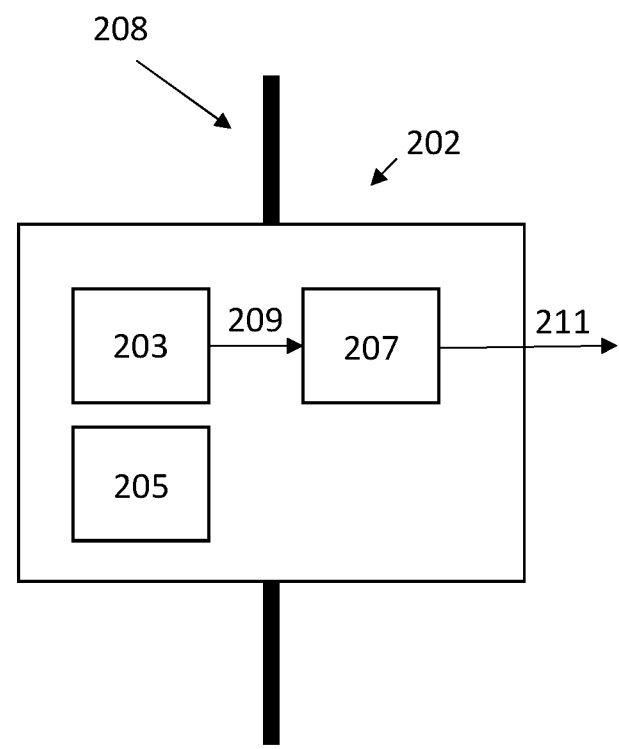
FIG. 2A is a schematic drawing of a monitoring device configured to detect disturbances or faults on a conductor of a power grid distribution network.

FIG. 2A is a schematic diagram of a monitoring device 202 mounted on a primary conductor 208, illustrating the main schematic components of the device. The monitoring device 202 can include a current sensing element 203 configured to sense a current of the primary conductor 208, a power harvesting element 205 configured to harvest power from primary conductor 208, and a fault detection circuit 207 that is electrically connected to the current sensing element. The current sensing element can be, for example, a Rogowski coil mounted around the primary conductor 208 to induce a voltage in the Rogowski coil that is proportional to the rate of change of current in the conductor. The Rogowski coil produces an output 209 that is not directly proportional to the current level of the current in the primary conductor, but rather is proportional to the slew rate of the current in the primary conductor (dI/dT). This output 209 is the "raw" output from the Rogowski coil. The output 209 of the Rogowski coil is input into the fault detection circuit 208, which provides a fault indication output 211 that can be used to determine if there is a fault or disturbance on the primary conductor 208.

Figure 2B:
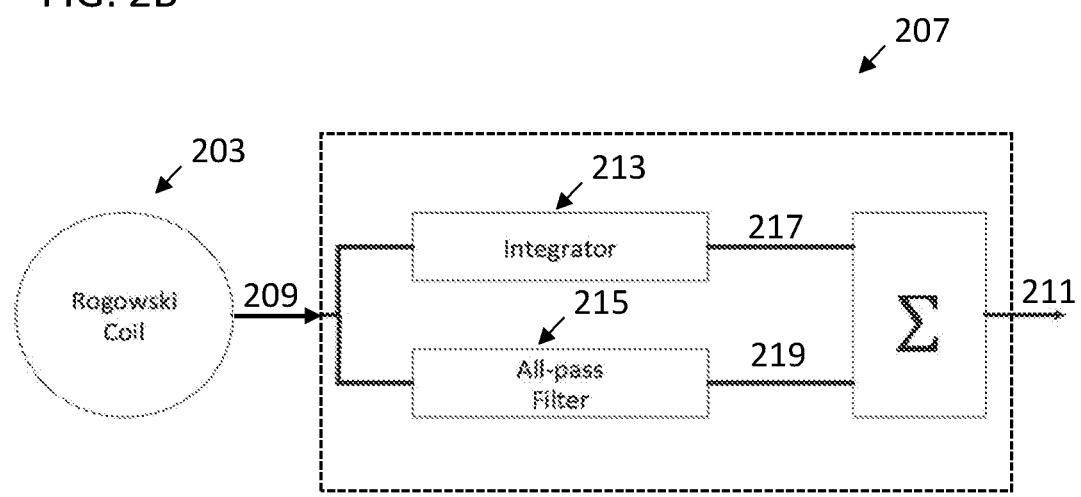
FIG. 2B is a schematic drawing of the components of a monitoring device including a Rogowski coil and a fault detection circuit.

FIG. 2B is another schematic diagram showing the current sensing element, or Rogowski coil 203, connected to the fault detection circuit 207. As shown, in this embodiment the fault detection circuit can comprise comprises an integrator 213 and an all pass filter 215 in a parallel configuration. The fault detection circuit 207 can be positioned inside the monitoring device, as shown in FIG. 2A, or alternatively, can be externally mounted but still electrically connected to the Rogowski coil. As described above, the output 209 from the Rogowski coil is a raw output that is proportional to the slew rate of the current in the primary conductor (dI/dT). This output 209 can be presented to the fault detection circuit which comprises an integrator 213 and an all-pass filter 215 in parallel. The fault detection circuit of the present disclosure utilizes two signals to produce the fault indication output 211; the first signal is the integrator output 217, representing the true current signal on the conductor as measured by the Rogowski coil, and the other signal is the pre-integrated or raw signal, directly from the Rogowski coil, which is passed through the all-pass filter to provide a filtered output 219. The two signal paths are processed separately, and then summed (e.g., subtracted, or summed with one of the inputs made negative) with a summation circuit 221 to create one final fault detection output 211, as shown in FIG. 2B. Any techniques or circuits for summing (subtracting) the outputs of the integrator circuit and the all-pass filter can be used, as known in the art.

The integrator path in the fault detection circuit 207 can have an ideal 90° phase shift over the frequency band of interest, and a sloping frequency response of approximately −20 dB per decade where the point of intercept of the fundamental frequency defines the gain (or attenuation) at the fundamental power frequency. The all-pass filter is configured to pass all frequencies equally in gain but change the phase relationship of the signal among various frequencies. The all-pass filter signal path of FIG. 2B can have complementary attributes to the integrator path, namely, a sloping phase shift response, where 90° of shift intercepts the fundamental power frequency, and a constant frequency response where the gain (or attenuation) is constant over the frequency band of interest.

Figure 3A:
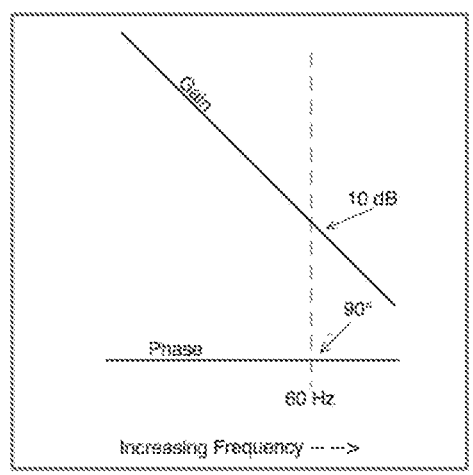
FIGS. 3A and 3B illustrate the frequency responses of both the integrator and the all-pass filter of the circuit of FIG. 2B.
Figure 3B:
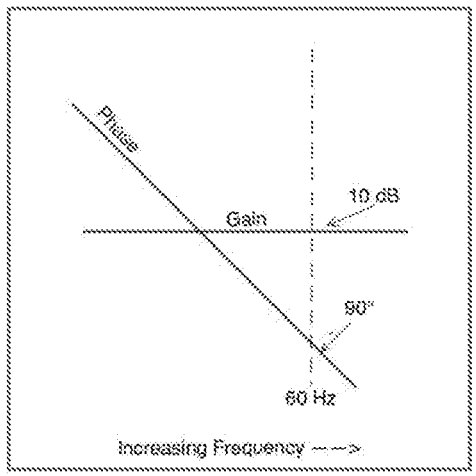

FIGS. 3A and 3B illustrate the frequency responses of both the integrator and the all-pass filter, respectively, of the circuit of FIG. 2B. It is noteworthy that although the two signal paths have altogether different characteristics, a pure sine wave, at the fundamental frequency (such as at 60 Hz for a power distribution network) the two signal paths have identical outputs. In the example above, they each have 10 dB of gain and a 90° phase shift at the fundamental frequency. Subtracting these two signals results in a null or zero output, again at the fundamental frequency. Thus, the fault detection circuit can be configured to indicate or detect disturbances or faults on the primary conductor when the output of the fault detection circuit is non-zero, as this output waveform that represents the amplitude and phase differences between the disturbance and the fundamental frequency.

In a traditionally used Rogowski coil, the "raw" output of the sensor coil is not accessible in many cases, it is only an internal connection and of no value. The novelty of the present disclosure is that the fault detection circuit is able to "reach inside" the Rogowski coil and connect a different type of filter to the raw Rogowski coil. Then by subtracting these two outputs, the resulting signal shows only the signals that are non-fundamental. These two filters respond to gain and phase in differing manners. But the circuit can be configured such that their outputs look identical at the fundamental frequency (e.g., 60 Hz). So with a pure 60 Hz current wave, the outputs from the integrator and all-pass filter subtract to zero. All other frequencies (e.g., disturbances) will have mis-matched outputs between the two filters, and therefore are exposed in the combined output. Thus, the output of the fault detection circuit in the present disclosure can be used to detect disturbances or faults in the primary conductor. When the output of the fault detection circuit is zero at the fundamental frequency, then there is not a fault or disturbance present on the primary conductor. However, if the output of the fault detection circuit is non-zero, then it can be an indication that a fault or disturbance is present on the primary conductor.

In some embodiments, this circuit can be implemented in ultra low-power analog circuitry. Because this circuit's output, in the absence of a disturbance, normally rests at a near zero level, the output can be monitored, for example, with a voltage comparator, and a trip threshold can be created in the monitoring device to indicate a disturbance is occurring.

Figure 4:
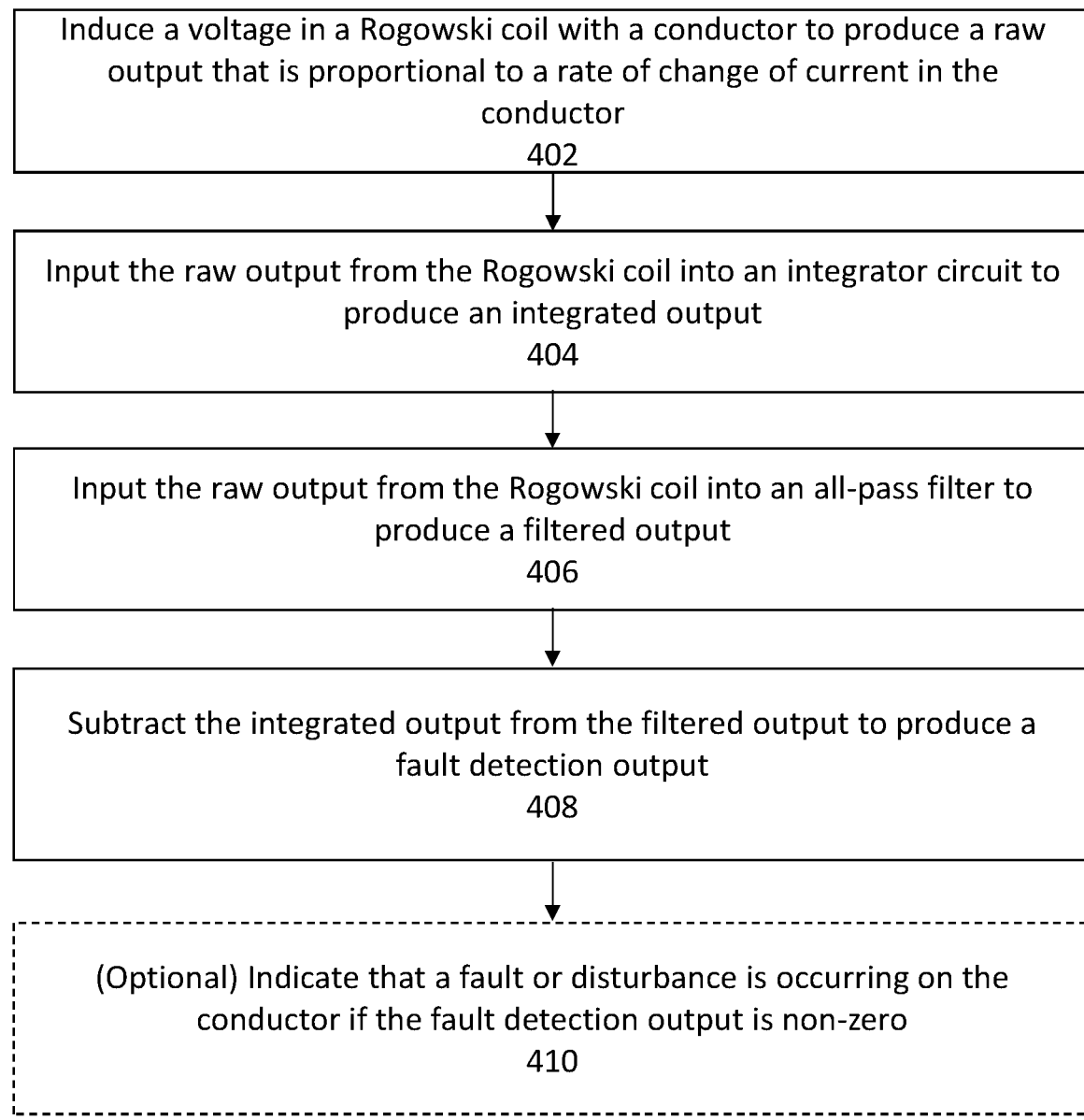
FIG. 4 is a flowchart describing a method for detecting a fault or disturbance on a conductor of a power distribution network.

FIG. 4 is a flowchart that describes a method for detecting a disturbance or fault on a conductor line of a power distribution network. At an operation 402 of the flowchart, a voltage can be induced in a Rogowski coil of a line monitoring device. As described above, the line monitoring device, and Rogowski coil, can be mounted to a conductor of a power distribution system. The voltage induced in the Rogowski coil can produce a raw output that is proportional to a rate of change of current in the conductor.

At an operation 404 of the flowchart, the raw output from the Rogowski coil can be input into an integrator circuit of the line monitoring device to produce an integrated output. This integrated output represents the true current signal on the conductor as measured by the Rogowski coil. Next, at an operation 406 of the flowchart, the raw output from the Rogowski coil can also be input into an all-pass filter of the line monitoring device to produce a filtered output. The all-pass filter of operation 406 is designed and configured to have complementary attributes to the integrated output, namely a sloping phase shift response and a constant gain over the frequency band of interest.

At an operation 408 of the flowchart, the integrated output of the integrator circuit can be summed/subtracted from the filtered output of the all-pass filter. As described above, the all-pass filter is designed to be complimentary to the integrator, such that at the fundamental frequency (or operating frequency of the conductor) the sum of the integrated output and the filtered output will be zero during normal operating conditions. Again, referring to FIGS. 3A and 3B, the frequency response of the integrator has a sloping gain and a constant phase shift of 90° over the frequency band of interest. The all-pass filter, however, has a sloping phase shift, with a phase shift of 90° at the fundamental frequency, and a constant gain over the frequency band of interest. At the fundamental frequency, the gain and phase shift of the two outputs are identical in normal operating conditions. Thus, subtracting these two outputs results in a zero output at the fundamental frequency during normal operating conditions. However, during fault or disturbance conditions, the two outputs sum out to a non-zero value. Thus, at operation 410, a non-zero fault detection output is indicative of a fault or disturbance on the conductor. This fault detection output can be transmitted or communicated from the line monitoring device in the event of a fault or disturbance (e.g., communicated wirelessly or by wire).

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of sensing a fault or disturbance on a conductor of a power distribution network, comprising:
    inducing a voltage in a Rogowski coil of a line monitoring device to produce a raw output;
    inputting the raw output from the Rogowski coil into an integrator circuit of the line monitoring device to produce an integrated output;
    inputting the raw output from the Rogowski coil into an all-pass filter of the line monitoring device to produce a filtered output;
    subtracting the integrated output from the filtered output to produce a fault detection output; and
    indicating that a fault or disturbance has occurred on the conductor if the fault detection output is a non-zero value.

2. The method of claim 1, further comprising, prior to the inducing step, mounting the line monitoring device on the conductor.

3. The method of claim 1, wherein the raw output of the Rogowski coil is proportional to a rate of change of current in the conductor.

4. The method of claim 1, wherein a frequency response of the integrator circuit has a sloping gain and a constant phase shift of 90° over a frequency band of interest.

5. The method of claim 4, wherein a frequency response of the all-pass filter has a sloping phase shift, with a phase shift of 90° at a fundamental frequency of the conductor, and a constant gain over the frequency band of interest.

6. The method of claim 1, wherein the subtracting step is performed at a fundamental frequency of the conductor.

7. The method of claim 6, wherein the fundamental frequency is 60 Hz.

8. The method of claim 6, wherein the fundamental frequency is 50 Hz.

9. A line monitoring device configured to detect a fault or disturbance on a conductor of a power distribution network, comprising:
    a housing configured to be mounted to the conductor;
    a Rogowski coil disposed on or within the housing, wherein a voltage is induced in the Rogowski coil to produce a raw output when current flows through the conductor; and
    a fault detection circuit disposed within the housing and being electrically coupled to the Rogowski coil, wherein the fault detection circuit comprises:
    an integrator circuit configured to receive the raw output from the Rogowski coil and produce an integrated output;
    an all-pass filter configured to receive the raw output from the Rogowski coil and produce a filtered output;
    a summation circuit configured to subtract the integrated output from the filtered output to produce a fault detection output;
    wherein the fault detection output indicates a fault or disturbance on the conductor if the fault detection output has a non-zero value.

10. The device of claim 9, wherein the raw output of the Rogowski coil is proportional to a rate of change of current in the conductor.

11. The device of claim 9, wherein a frequency response of the integrator circuit has a sloping gain and a constant phase shift of 90° over a frequency band of interest.

12. The device of claim 11, wherein a frequency response of the all-pass filter has a sloping phase shift, with a phase shift of 90° at a fundamental frequency of the conductor, and a constant gain over the frequency band of interest.

13. The device of claim 9, wherein subtracting is performed at a fundamental frequency of the conductor.

14. The device of claim 13, wherein the fundamental frequency is 60 Hz.

15. The device of claim 13, wherein the fundamental frequency is 50 Hz.

16. A fault detection system, comprising:
    a conductor of a power distribution network;
    a housing configured to be mounted to the conductor;
    a Rogowski coil disposed on or within the housing, wherein the conductor is configured to induce a voltage in the Rogowski coil to produce a raw output when current flows through the conductor; and
    a fault detection circuit disposed within the housing and being electrically coupled to the Rogowski coil, wherein the fault detection circuit comprises:
    an integrator circuit configured to receive the raw output from the Rogowski coil and produce an integrated output;
    an all-pass filter configured to receive the raw output from the Rogowski coil and produce a filtered output;
    a summation circuit configured to subtract the integrated output from the filtered output to produce a fault detection output;
    wherein the fault detection output indicates a fault or disturbance on the conductor if the fault detection output has a non-zero value.

* * * * *